(12) United States Patent
Gstrein et al.

(10) Patent No.: US 12,036,578 B1
(45) Date of Patent: Jul. 16, 2024

(54) INTERCONNECT STRUCTURE SURFACE MODIFICATIONS BY PASSIVATING AGENTS

(71) Applicant: Intel Corporation, Santa Clara, CA (US)

(72) Inventors: Florian Gstrein, Portland, OR (US); James M. Blackwell, Portland, OR (US); Eungnak Han, Portland, OR (US); Rami Hourani, Beaverton, OR (US); Tayseer Mahdi, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1244 days.

(21) Appl. No.: 16/424,338

(22) Filed: May 28, 2019

(51) Int. Cl.
| | |
|---|---|
| *B05D 3/00* | (2006.01) |
| *B01J 19/00* | (2006.01) |
| *B05D 3/10* | (2006.01) |
| *C07F 9/28* | (2006.01) |
| *C07F 9/38* | (2006.01) |
| *C07F 9/40* | (2006.01) |
| *C25D 11/00* | (2006.01) |
| *H01L 21/56* | (2006.01) |
| *H01L 21/768* | (2006.01) |
| *H01L 23/29* | (2006.01) |
| *H01L 23/522* | (2006.01) |
| *H05K 1/18* | (2006.01) |

(52) U.S. Cl.
CPC ............ *B05D 3/002* (2013.01); *B01J 19/006* (2013.01); *B05D 3/10* (2013.01); *C07F 9/28* (2013.01); *C07F 9/38* (2013.01); *C07F 9/40* (2013.01); *C07F 9/4021* (2013.01); *C25D 11/00* (2013.01); *H01L 21/56* (2013.01); *H01L 21/76831* (2013.01); *H01L 23/293* (2013.01); *H01L 23/5226* (2013.01); *H05K 1/181* (2013.01); *H05K 2201/0137* (2013.01); *H05K 2201/0195* (2013.01)

(58) Field of Classification Search
CPC .......... B05D 3/002; B05D 3/10; B01J 19/006; C07F 9/28; C07F 9/38; C07F 9/40; C07F 9/4021; C25D 11/00; H01L 21/56; H01L 21/76831; H01L 23/293; H01L 23/5226; H05K 1/181; H05K 2201/0137; H05K 2201/0195
See application file for complete search history.

(56) References Cited

U.S. PATENT DOCUMENTS

| | | | |
|---|---|---|---|
| 2006/0128142 A1* | 6/2006 | Whelan | B82Y 30/00 257/E21.171 |
| 2017/0154790 A1* | 6/2017 | Hua | C23C 18/2006 |

* cited by examiner

*Primary Examiner* — Andrew J. Oyer
(74) *Attorney, Agent, or Firm* — Schwabe, Williamson & Wyatt P.C.

(57) ABSTRACT

Embodiments herein describe techniques for a semiconductor device including an interconnect structure. The interconnect structure may have a segment of a passivant layer including a SAM. The SAM may include head groups, and chains attached to the head groups. The chains include functional groups that are cross-linkable at end or side of the chains to result in chain extension by reacting with another SAM or polymer, densification by crosslinking with an adjacent SAM, or polymerization having an initiator as the SAM or the SAM attached to another SAM. Other embodiments may be described and/or claimed.

18 Claims, 8 Drawing Sheets

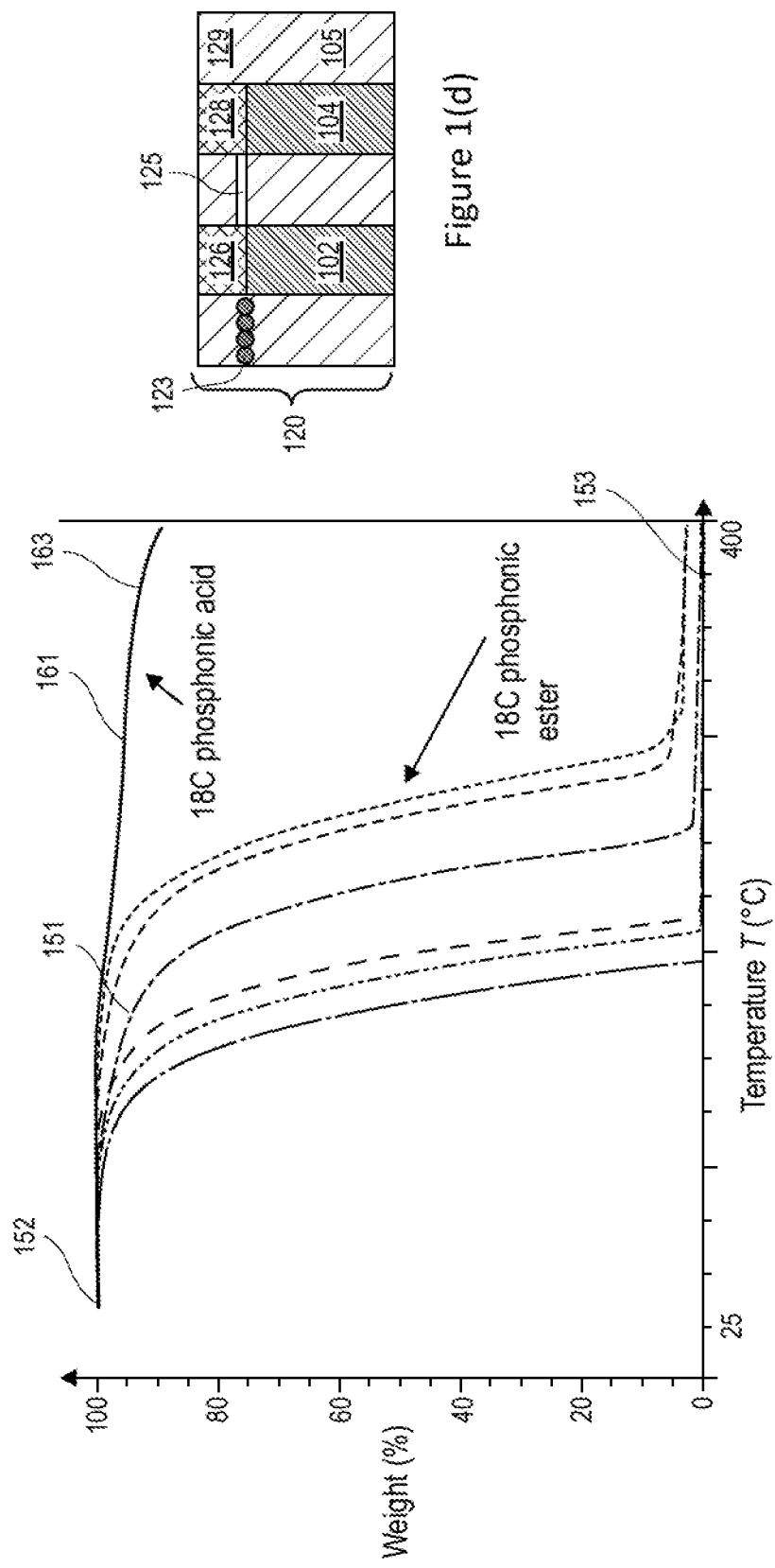

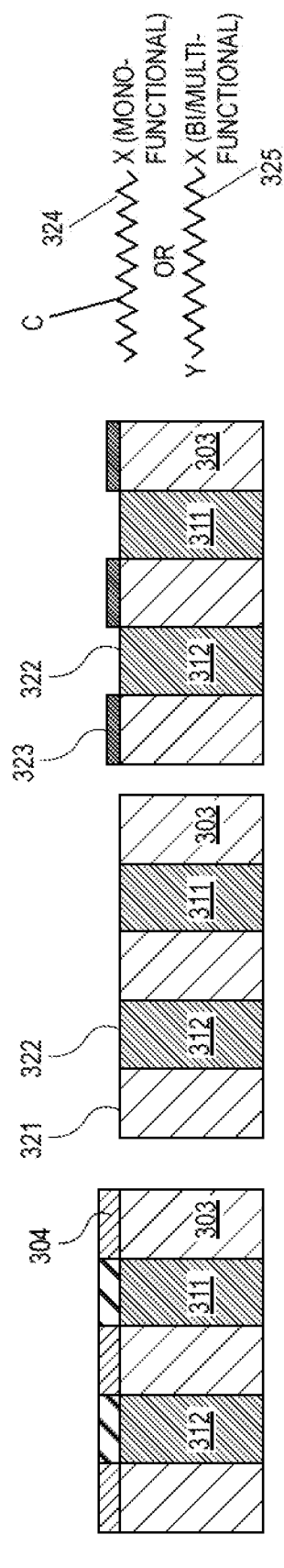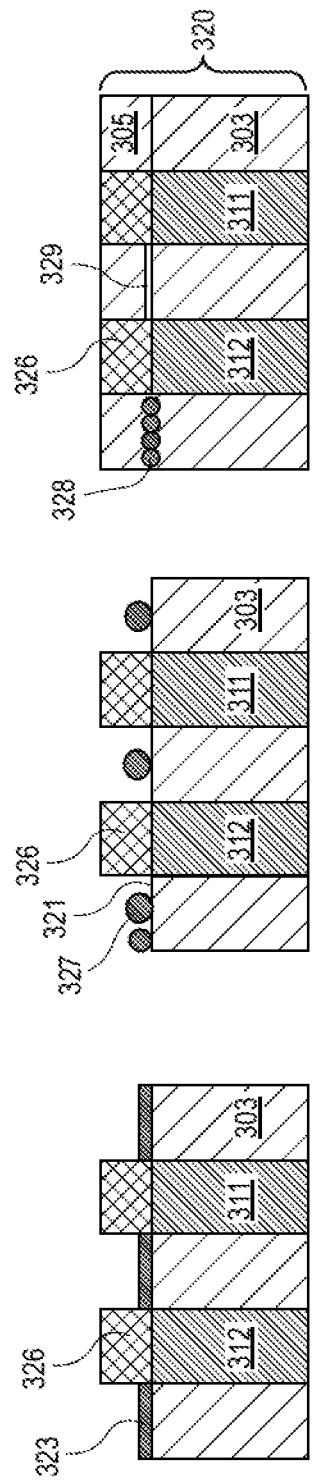
Figure 3(a) Figure 3(b) Figure 3(c) Figure 3(d) Figure 3(e) Figure 3(f)

INTERCONNECT STRUCTURE SURFACE MODIFICATIONS BY PASSIVATING AGENTS

FIELD

Embodiments of the present disclosure generally relate to the field of integrated circuits, and more particularly, to the surface modification of interconnect structures of integrated circuits.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Integrated circuits (ICs) normally include an interconnect structure formed above a semiconductor substrate at the back-end-of-line (BEOL). Various components or features may be included in the interconnect structure, e.g., dielectric layers, vias, interconnects, and more. Normally, such components may be formed by a lithographic process based on patterns formed using photoresist materials. With the continuous scaling of features in integrated circuits, the sizes of the components, e.g., a size of a critical dimension, become smaller and smaller. As a result, it may become more difficult to use the lithographic process based on the photoresist patterning. As an alternative, the chemical modification of surfaces of the layers in an interconnect structure may be used to form such small features and components. However, current solutions to the chemical modification of surfaces may suffer limited solubility for spin-on passivation processes, or poor volatility for vapor delivery. Improvements are desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 1(a)-1(d) schematically illustrate example interconnect structures including a passivant layer with a self-assembled monolayers (SAM), in accordance with various embodiments.

FIGS. 3(a)-3(g) illustrate a process for forming an interconnect structure including a passivant layer with a SAM, in accordance with various embodiments.

DETAILED DESCRIPTION

Figure 1A:
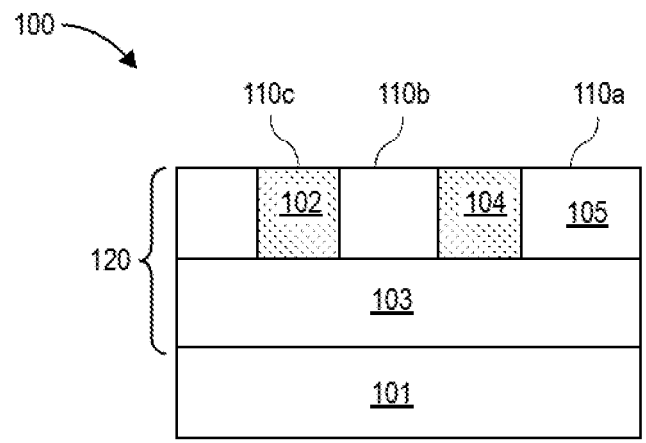

An integrated circuit (IC) may include various components or features, e.g., dielectric layers, vias, interconnects, and more, formed within an interconnect structure above a semiconductor substrate at the back-end-of-line (BEOL). With continuous scaling down of critical dimensions of the features, the traditional lithographic process may face more difficulties in forming such features. The chemical modification of surfaces, e.g., selective grafting of molecules, may be applied to the layers of an interconnect structure to facilitate the formation of various components and features. For example, passivation agents, e.g., self-assembled monolayer (SAM), may be such molecules used to modify the surfaces of layers of an interconnect structure.

However, currently used SAM may face many problems. For example, currently used SAM may have limited solubility for spin-on passivation processes, or poor volatility for vapor delivery of such SAMs. As a result, a lengthy and unpractical passivation time period may be needed to achieve efficient packing of the molecules. As an example, phosphonic acid ($RPO_3H_2$) can graft onto a wide range of metals and metal oxides to form robust and stable metal-OP bonds. However, due to the limited solubility in coating solvents and non-volatile nature of such chemistry, SAMs based on phosphonic acids are normally soaked in a solution for long durations, e.g., 48 hours, to achieve good passivation. Furthermore, the strong acidic nature of these acids may damage some surfaces of the layers in the interconnect structure. In addition, only a limited number of known SAMs can be used in the vapor phase, but most of which are not stable at practical temperatures of industrial processes. Moreover, currently available SAMs have displayed stability on the substrate surface within a limited temperature window. High temperatures generally result in decomposition of the SAM. These disadvantages limit the usage of SAMs to narrow process windows. As a result, SAMs have not been used as a versatile option for surface modification.

Embodiments herein may present families of SAMs that have enhanced solubility and volatility that can lead to reliable processes for providing selective passivation in practical ways in either solution dip, spin-on, or vapor phase. In detail, SAMs presented in embodiments herein may include possible types of molecules with single, dual, or multiple functionalities. The molecules could also be multifunctional with several branching units on the main chain. For example, the strong H— bonding interactions of molecules may be replaced with R groups such as in the case of phosphonic esters ($RPO_3R_2$, R groups are not limited to C—H type functionalities). These molecules provide the same passivation functionality while providing greater solubility in common solvents, and increased volatility to be used in vapor phase passivation. It is worth noting that the R group byproducts of such reactions can also have impact on the surrounding surface properties, leaving behind distinctive detectable characteristics. Embodiments herein may be applicable to various interconnection structures, e.g., edge placement, error mitigation, metal gap fill of high aspect ratio features, or fin sidewall cladding.

Embodiments herein may present an integrated circuit including an interconnect structure, which may include one or more layers above a substrate. A surface of a layer of the one or more layers of the interconnect structure includes a first portion of the surface having a first material, and a second portion of the surface having a second material. A segment of a passivant layer may be attached to the first portion of the surface. The passivant layer includes a self-assembled monolayers (SAM). In detail, the SAM includes head groups selectively bounded to the first portion of the surface, and chains attached to the head groups. The chains include functional groups that are cross-linkable at end or side of the chains to result in chain extension by reacting with another SAM or polymer, densification by crosslinking with an adjacent SAM, or polymerization having an initiator as the SAM or the SAM attached to another SAM.

In embodiments, a method for forming a semiconductor device is presented. The method includes providing a dielectric layer including one or more conductive components embedded within the dielectric layer. The dielectric layer is a part of an interconnect structure of the semiconductor device. A surface of the dielectric layer includes a first surface portion having a dielectric material, and a second surface portion having a metallic material. The method further includes forming one or more segments of a passivant layer attached to a portion selected from the first surface portion or the second surface portion of the dielectric layer. The passivant layer includes a SAM. The SAM includes head groups selectively bounded to the selected portion, and chains attached to the head groups. The chains include functional groups that are cross-linkable at end or side of the chains to result in chain extension by reacting with another SAM or polymer, densification by crosslinking with an adjacent SAM, or polymerization having an initiator as the SAM or the SAM attached to another SAM.

Embodiments herein may present a computing device, which may include a print circuit board (PCB), and a semiconductor device coupled to the PCB and including an active device or a passive device. The semiconductor device includes an interconnect structure having one or more layers above a substrate. A surface of a layer of the one or more layers includes a first portion of the surface having a first material, and a second portion of the surface having a second material. A segment of a passivant layer is attached to the first portion of the surface. The passivant layer includes a SAM. The SAM includes head groups selectively bounded to the first portion of the surface, and chains attached to the head groups. The chains include functional groups that are cross-linkable at end or side of the chains to result in chain extension by reacting with another SAM or polymer, densification by crosslinking with an adjacent SAM, or polymerization having an initiator as the SAM or the SAM attached to another SAM.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, zinc oxide or other combinations of group III-V, II-VI, group IV, or semiconducting oxide materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And, in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
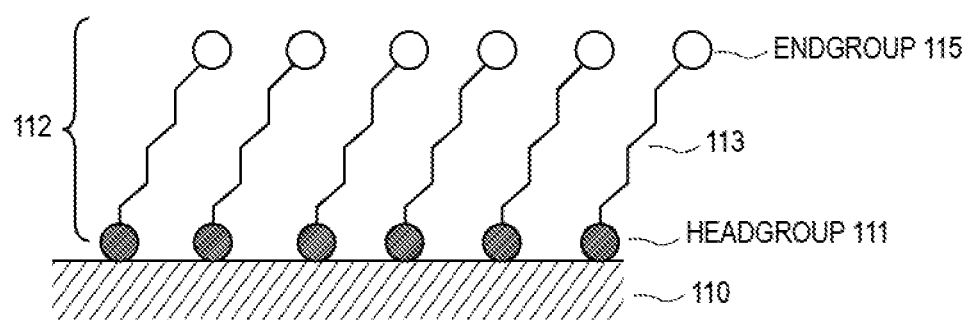

FIGS. 1(a)-1(d) schematically illustrate example interconnect structures including a passivant layer with a self-assembled monolayers (SAM), in accordance with various embodiments. FIG. 1(a) shows an interconnect structure 120 including one or more layers above a substrate 101. FIGS. 1(b)-1(c) illustrate a SAM 112 attached to a portion of a surface 110, and the properties of the SAM. FIG. 1(d) illustrates a segment of a passivant layer 123 attached to a portion of a surface, the passivant layer including a SAM.

In embodiments, as shown in FIG. 1(a), a semiconductor device 100 includes the interconnect structure 120 on the substrate 101. The interconnect structure 120 includes a dielectric layer 103, and a dielectric layer 105. The dielectric layer 105 includes one or more conductive components, e.g., a conductive component 102, a conductive component 104, embedded within the dielectric layer 105. The dielectric layer 105 has a surface 110a, which includes a first surface portion 110b having a dielectric material, and a second surface portion 110c having a metallic material. The second surface portion 110c is a metallic surface of the conductive component 102, while the first surface portion 110b is a dielectric surface of the dielectric material of the dielectric layer 105. In embodiments, the second surface portion 110c as a metallic surface may include a metal surface, a metal oxide surface, or a silicon oxide surface. In addition, the first surface portion 110b as a dielectric surface may include a surface of an interlayer dielectric (ILD) layer, a hardmask layer, or a dielectric capping layer. There may be other layers, e.g., conductive layers, within the interconnect structure 120, not shown.

In embodiments, as shown in FIG. 1(b), a segment of a passivant layer 112 is attached to a surface 110. The surface 110 may be the first surface portion 110b or the second surface portion 110c as shown in FIG. 1(a). The passivant layer 112 includes a SAM, which includes head groups 111 selectively bounded to the surface 110, and chains 113 attached to the head groups 111. The chains 113 may include functional groups that are cross-linkable at end or side of the chains to result in chain extension by reacting with another SAM or polymer, densification by crosslinking with an adjacent SAM, or polymerization having an initiator as the SAM or the SAM attached to another SAM. In addition, the SAM may optionally include end groups 115, which may be various functional groups as well.

In embodiments, the functional groups in the chains 113 may include CN, OH groups, $N_3$, C≡C, C=C, thiols (SH), amines (NH), epoxides, cyclopropanes, imino groups, aromatic groups, halogens, SiH, SiCl, vinylsilane, or COOH. In some other embodiments, the functional groups in the chains 113 may include alkyl groups, aromatic and polycyclic aromatic groups, fluorinated alkyl groups, combination of alkyl groups with aromatic substituents, (C1-C22) alkyl groups, octadecyl, fluorohydrocarbons, heptadecafluoro, fluorinated groups between C1-C22, fluorinated alkyl groups with fluorinated aromatic substituents, or non-fluorinated alkyl groups with fluorinated aromatic substituents.

In embodiments, when the surface 110 is a metallic surface, the head groups 111 may include phosphoate esters, phosphonate esters, phosphonamide, sulfonamides, sulfenate, sulfinate, sulfonate, or boronic acid. Additionally and alternatively, when the surface 110 is a metallic surface, the head groups 111 may include alkenes, alkynes, amines, hydroxides, phosphines, thiols, phosphonic acids, carboxylic acids, or phosphorous dichloride. Meanwhile, when the surface 110 is a metallic surface, the functional groups in the chains 113 may include $C_1$-$C_{22}$, $C_5H_5$-$C_{17}H_{37}$, indenyl, alkenes, alkynes, or phenyl; and the head groups includes $PO_3H_2$, P(O)(OH)(OEt), P(O)(OEt)$_2$O, P(O)(OH)(OSiMe$_3$), P(O)(OSiMe$_3$))$_2$O, P(O)(OEt)$_2$, P(O)(OSiMe$_3$)$_2$, P(O)Cl$_2$, P(O)(NMe$_2$)$_2$, P(O)(OH)(NMe$_2$), S(O)$_2$(NMe$_2$), S(O)(NMe$_2$), B(OH)$_2$, P(O)(OGeR$_3$)$_2$, P(O)(OH)(OGeR$_3$), P(O)(OSnR$_3$)$_2$, P(O)(OH)(OSnR$_3$), P(O)(OBR$_2$)$_2$, P(O)(OH)(OBR$_2$), P(O)(OAlR$_2$)$_2$, P(O)(OH)(OAlR$_2$), $R_3$PO, $R_3$OP, COOH, amides, CN, enamides, amidinates, guanidinates, enolates with SiMe$_3$ substituents, or guanidinates, enolates without SiMe$_3$ substituents.

In embodiments, when the surface 110 is a dielectric surface, the head groups 111 may include alkoxysilanes, aminosilanes, or chlorosilanes, or mono-, di- and tri-substituted groups of alkoxysilanes, aminosilanes, or chlorosilanes. Overall, when the surface 110 is a dielectric surface, the SAM at the passivant layer 112 attached to the surface 110 may include octadecyl trichlorosilane, trimethoxy(octadecyl)silane, triethoxy heptadecafluorodecylsilane, octadecyltris(dimethylamino)silane or 5-8 membered cyclic silanes such as N-n-butyl-aza-2,2-dimethoxysilacyclopentane triethoxy hexamethylsilanetriamine.

In embodiments, the head groups 111 may have a first reaction to the first portion of the surface, and the SAM at the passivant layer 112 includes the end groups 115 attached to the chains 113, where the end groups 115 include an orthogonal type of chemical functionality that allows a second reaction with a polymerization material, a chain extension with another SAM or with an adjacent SAM. For example, the end groups 115 may include aminosilanes (CH$_2$)$_n$phosphonate, alkokysilane(CH$_2$)$_n$phosphonate, hydrosilanes(CH$_2$)$_n$phosphonate, aminoalkylphosphonate, cyanoalkylphosphonate, alkynylalkylphosphonate, azidoalkylphosphonate, hydroxyalkylphosphonate, or epoxyalkylphosphonate, CN, OH groups, $N_3$, C≡C, C=C, thiols (SH), amines (NH), epoxides, cyclopropanes, imino groups, aromatic groups, halogens, silyl groups (SiH, SiCl, vinylsilane) and COOH or an orthogonally reactive material for a third reaction with an adjacent SAM by cross-linking.

In embodiments, in more specific details, the SAM at the passivant layer 112 may include a material selected from the group consisting of $C_{18}H_{37}PO_3H_2$, $C_{18}H_{37}P(O)(OH)(OEt)$, $C_{18}H_{37}P(O)(OEt)_2$, $C_{18}H_{37}P(O)Cl_2$, $C_{18}H_{37}P(O)(OH)Cl$, $C_{18}H_{37}P(O)(NMe_2)_2$, $C_{18}H_{37}P(O)(OH)(NMe_2)$, $C_{18}H_{37}S(O)_2(NMe_2)$, $C_{18}H_{37}S(O)(OSiMe_3)$, $C_{18}H_{37}S(OSiMe_3)$, $C_{18}H_{37}S(O)_2(OSiMe_3)$, $C_{18}H_{37}S(O)(NMe_2)$, $C_{18}H_{37}B(OH)_2$, $C_5H_5$-$C_{17}H_{37}$, $C_{18}H_{37}P(O)(OH)(OGeR_3)$, $C_{18}H_{37}P(O)(OGeR_3)_2$, $(C_{18}H_{37}P(O)(OGeR_3))_{20}$; $(C_{18}H_{37}P(O)(OGeR_3))_2(CH_2)_n$, $(C_{18}H_{37}P(O)(OGeR_3))_2(C_6H_4)_n$, $C_{18}H_{37}OP(O)(OGeR_3)_2$, $(C_{18}H_{37}OP(O)(OGeR_3))_2(CH_2)_n$, $(C_{18}H_{37}OP(O)(OGeR_3))_2(C_6H_4)_n$, $C_{18}H_{37}OP(O)(OH)(OGeR_3)$, $(C_{18}H_{37}OP(O)(OGeR_3))_{20}$; $C_{18}H_{37}S(O)_2(OGeR_3)$, $C_{18}H_{37}S(O)(OGeR_3)$, $C_{18}H_{37}S(OGeR_3)$, $C_{18}H_{37}B(OGeR_3)_2$; $C_{18}H_{37}P(O)(OH)(OSnR_3)$, $C_{18}H_{37}P(O)(OSnR_3)_2$, $(C_{18}H_{37}P(O)(OSnR_3))_2O$, $(C_{18}H_{37}P(O)(OSnR_3))_2(CH_2)_n$, $(C_{18}H_{37}P(O)(OSnR_3))_2(C_6H_4)_n$, $C_{18}H_{37}OP(O)(OSnR_3)_2$, $C_{18}H_{37}OP(O)(OH)(OSnR_3)$, $(C_{18}H_{37}OP(O)(OSnR_3))_2O$, $(C_{18}H_{37}OP(O)(OSnR_3))_2(CH_2)_n$, $(C_{18}H_{37}OP(O)(OSnR_3))_2(C_6H_4)_n$, $C_{18}H_{37}S(O)_2(OSnR_3)$, $C_{18}H_{37}S(O)(OSnR_3)$, $C_{18}H_{37}S(OSnR_3)$, $C_{18}H_{37}B(OSnR_3)_2$; $C_{18}H_{37}P(O)(OH)(OBR_2)$, $C_{18}H_{37}P(O)(OBR_2)_2$, $(C_{18}H_{37}P(O)(OBR_2))_2O$, $(C_{18}H_{37}P(O)(OBR_2))_2(CH_2)_n$, $(C_{18}H_{37}P(O)(OBR_2))_2(C_6H_4)_n$, $C_{18}H_{37}OP(O)(OBR_2)_2$, $C_{18}H_{37}OP(O)(OH)(OBR_2)$, $(C_{18}H_{37}OP(O)(OBR_2))_2O$, $(C_{18}H_{37}OP(O)(OBR_2))_2(CH_2)_n$, $(C_{18}H_{37}OP(O)(OBR_2))_2(C_6H_4)_n$, $C_{18}H_{37}S(O)_2(OBR_2)$, $C_{18}H_{37}S(O)(OBR_2)$, $C_{18}H_{37}S(OBR_2)$, $C_{18}H_{37}B(OBR_2)_2$, $C_{18}H_{37}B(OH)_2$, $C_{18}H_{37}B(OSiMe_3)_2$; $C_{18}H_{37}P(O)(OH)(OAlR_2)$, $C_{18}H_{37}P(O)(OAlR_2)_2$, $(C_{18}H_{37}P(O)(OAlR_2))_2O$, $(C_{18}H_{37}P(O)(OAlR_2))_2(CH_2)_n$, $(C_{18}H_{37}P(O)(OAlR_2))_2(C_6H_4)_n$, $C_{18}H_{37}OP(O)(OAlR_2)_2$, $(C_{18}H_{37}OP(O)(OAlR_2))_2O$, $C_{18}H_{37}OP(O)(OH)(OAlR_2)$, $(C_{18}H_{37}OP(O)(OAlR_2))_2(CH_2)_n$, $(C_{18}H_{37}OP(O)(OAlR_2))_2(C_6H_4)_n$, $C_{18}H_{37}S(O)_2(OAlR_2)$, $C_{18}H_{37}S(O)(OAlR_2)$, $C_{18}H_{37}S(OAlR_2)$, and $C_{18}H_{37}B(OAlR_2)_2$.

In some embodiments, the SAM at the passivant layer 112 may be a first sublayer of the passivant layer 112 above the surface 110, and the passivant layer 112 further includes a second passivant sublayer including hydrophobic polymer brushes with an end group, or a molecule including a chain with 1 to 22 C atoms and an end group. The second passivant sublayer is attached to the SAM of the first sublayer by chain extension, cross linking, or polymerization with the SAM as an initiator.

In embodiments, various SAM materials presented may have enhanced solubility and volatility that can lead to reliable processes for providing selective passivation in practical ways in either solution dip, spin-on, or vapor phase. For example, as shown in FIG. 1(c), a curve 151 shows an evaporation process of 18C phosphonic ester, and a curve 161 shows an evaporation process of 18C phosphonic acid. The material 18C phosphonic ester is a material presented in embodiments herein, while 18C phosphonic acid is a SAM currently used in the market. At 25C shown in point 152, both the phosphonic ester and the 18C phosphonic acid are in a solid state without much mass loss. At temperature 400 shown by point 153, as shown in the curve 151, 18C phosphonic ester has almost 100% mass loss, nearly completely evaporated. On the other hand, as shown in the curve 161, 18C phosphonic acid has nearly 90% of the mass remaining shown by point 163, without much evaporation. The effectiveness of SAM presented in embodiments herein is clearly shown in the curve 151, and a few other similar curves.

In embodiments, as shown in FIG. 1(d), the interconnect structure 120 further includes a dielectric layer 129 above the dielectric layer 105. The dielectric layer 129 includes cap layer components 126 and 128 above the conductive component 102 and the conductive component 104 within the dielectric layer 105. A passivant layer 123 is between the dielectric layer 105 and the dielectric layer 129. The passivant layer 123 may be a residue SAM material, which may be used to form the cap layer components 126 and 128. During the process of forming the cap layer components 126 and 128, a passivant layer may be used to cover the dielectric portion for the surface of the dielectric layer 105, while leaving the surfaces of the conductive component 102 and the conductive component 104 not covered. The cap layer components 126 and 128 are then formed on the conductive component 102 and the conductive component 104. Afterwards, operations may be performed to remove the passivant layer 123 covering the dielectric portion of the surface of the dielectric layer 105. The dielectric layer 129 may further be deposited above the dielectric layer 105. As a result of the removal, a gap 125 may be formed between the dielectric layer 129 and the dielectric layer 105, while a residue passivant layer 123 may still remain between the dielectric layer 129 and the dielectric layer 105. In addition, the interconnect structure 120 may further include other layers or materials, e.g., HfO2, ZrO2, Al2O3, Y2O3, SiO2, SiO2, Al2O3, HfN, ZrN, AlN, SiN, RuN, TaN, TaCN, carbides, carbo nitirdes, borides, metal nitride, metal carbo nitride, or a high-k material compatible with the SAM.

Figure 2:
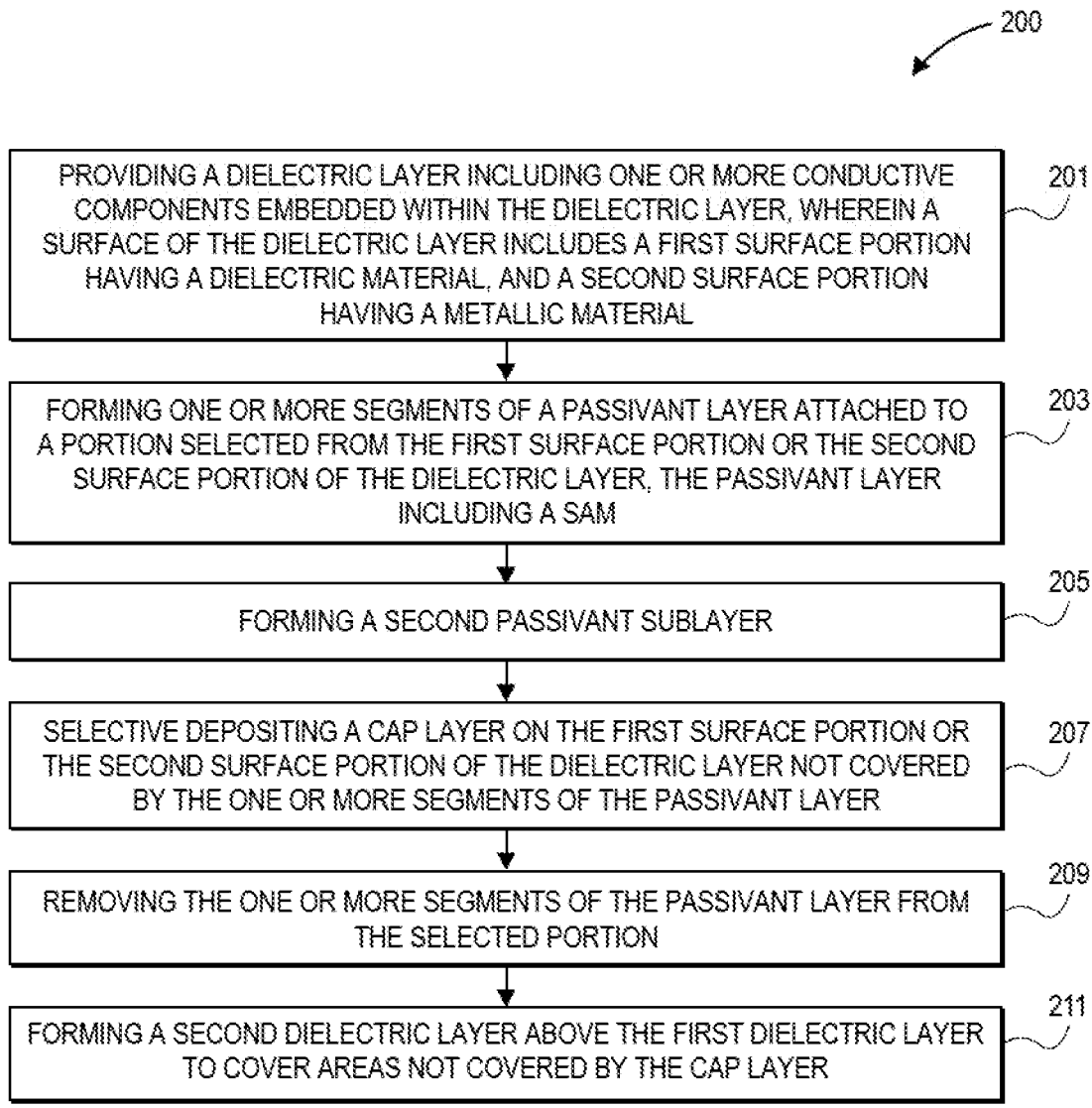
FIG. 2 illustrates a diagram of a process for forming an interconnect structure including a passivant layer with a SAM, in accordance with various embodiments.

FIG. 2 illustrates a diagram of a process 200 for forming an interconnect structure including a passivant layer with a SAM, in accordance with various embodiments. In embodiments, the process 200 may be applied to form the interconnect structure 120 as shown in FIGS. 1(a)-1(d). FIGS. 3(a)-3(g) illustrate the process 200 in more details for forming an interconnect structure including a passivant layer. FIGS. 4(a)-4(f) illustrate various interconnect structures where a passivant layer with a SAM may be formed, in accordance with various embodiments.

At block 201, the process 200 may include providing a dielectric layer including one or more conductive components embedded within the dielectric layer, wherein a surface of the dielectric layer includes a first surface portion having a dielectric material, and a second surface portion having a metallic material. For example, as shown in FIG. 3(b), a dielectric layer 303 may be provided, where the dielectric layer 303 includes one or more conductive components, e.g., a conductive component 311, a conductive component 312, embedded within the dielectric layer 303. A surface of the dielectric layer 303 includes a first surface portion 321 having a dielectric material, and a second surface portion 322 having a metallic material. In embodiments, the dielectric layer 303 may be a part of an interconnect structure of the semiconductor device with one or more other layers, not shown. In some embodiments, as shown in FIG. 3(a), the dielectric layer 303 may be at least partially covered by a contaminated layer 304, and the method 200 may include cleaning up the dielectric layer 303 by removing the contaminated layer 304.

At block 203, the process 200 may include forming one or more segments of a passivant layer attached to a portion selected from the first surface portion or the second surface portion of the dielectric layer, the passivant layer including a SAM. The passivant layer may be formed by solution dip operations, spin-on operations, or vapor phase operations. For example, as shown in FIG. 3(c), the process 200 may include forming one or more segments of a first passivant layer 323 attached to the first surface portion 321 of the dielectric layer 303. The first passivant layer 323 includes a SAM, and is selectively attached to the first surface portion 321 having a dielectric material, but not attached to the second surface portion 322 having a metallic material. In some other embodiments, a passivant layer may be selectively attached to the second surface portion 322, but not attached to the first surface portion 321. The first passivant layer 323 may be used to form a pattern so that other features, e.g., a cap layer 326 as shown in FIG. 3(d), may be formed. Normally, a photoresist material may be used to form such a pattern. The first passivant layer 323 includes a SAM which may have an advantage in patterning small features when a photoresist material pattern may be difficult to form, e.g., due to limitations of lithographic processes. In embodiments, the SAM in the first passivant layer 323 may be a monofunctional SAM 324 that includes head groups X and chains C, or alternatively, a multi-functional SAM 325 that includes head groups X, chains C, and end groups Y. The head groups X may be selectively bounded to the first surface portion 321. The chains C may be attached to the head groups X. In some embodiments, the chains C may include functional groups that are cross-linkable at end or side of the chains to result in chain extension by reacting with another SAM or polymer, densification by crosslinking with an adjacent SAM, or polymerization having an initiator as the SAM or the SAM attached to another SAM, as demonstrated and described in FIGS. 1(a)-1(d).

Figure 3G:
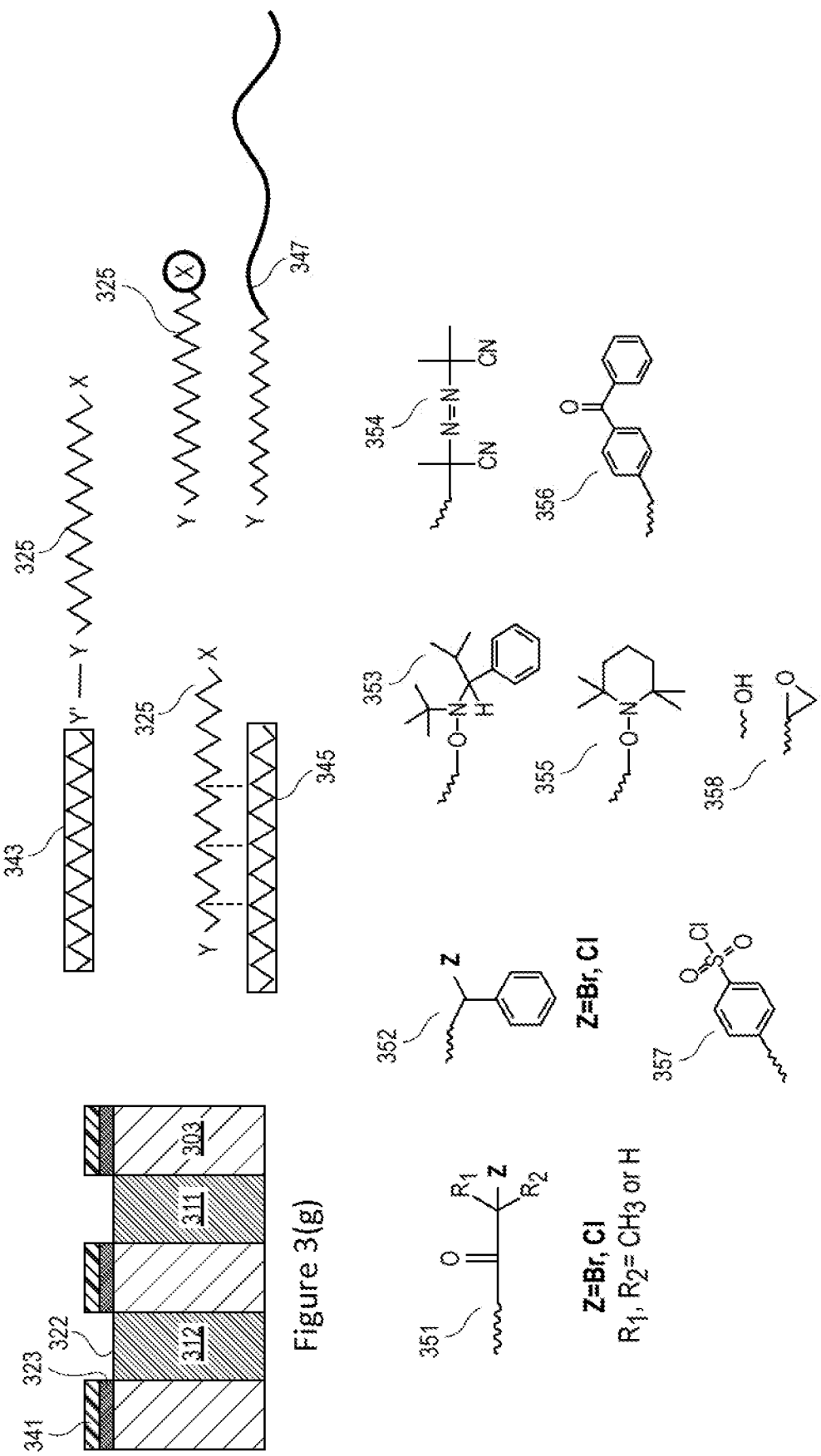

At block 205, optionally, the process 200 may include forming a second passivant sublayer attached to the SAM of the first passivant layer 323 by chain extension, cross linking, or polymerization with the SAM as an initiator. For example, as shown in FIG. 3(g), the process 200 may include forming a second passivant layer 341 attached to the SAM of the first passivant layer 323 by chain extension, cross linking, or polymerization with the SAM as an initiator. Sometimes, the first passivant layer 323 may be referred to as a first passivant sublayer, while the second passivant layer 341 may be referred to as a second passivant sublayer of a same passivant layer. In detail, the first passivant layer 323 may include a SAM 325. The second passivant layer 341 may include a SAM 343 that is linked to the SAM 325 by chain extension. Additionally and alternatively, the second passivant layer 341 may include a SAM 345 that is linked to the SAM 325 by cross linking. Furthermore, in some embodiments, the second passivant layer 341 may be formed by polymerization with the SAM 325 as an initiator, or by an initiator including the SAM 325 attached to another SAM 347. In some embodiments, the second passivant layer 341 may include hydrophobic polymer brushes with an end group, or a molecule including a chain with 1 to 22 C atoms and an end group. In detail, some examples of the SAM 325 may have an end group Y selected from SAM 351-358, as shown in FIG. 3(g).

At block 207, the process 200 may include selective depositing a cap layer on the first surface portion or the second surface portion of the dielectric layer not covered by the one or more segments of the passivant layer. For example, as shown in FIG. 3(d), the process 200 may include selective depositing a cap layer 326 on the second surface portion 322 of the dielectric layer 303 not covered by the one or more segments of the first passivant layer 323, or the second passivant layer 341 when multiple passivant sublayers are formed. The first passivant layer 323 serves as a pattern for forming the cap layer 326.

At block 209, the process 200 may include removing the one or more segments of the passivant layer from the selected portion. For example, as shown in FIG. 3(e), the process 200 may include removing the first passivant layer 323 from the first surface portion 321. However, some residues 327 of the first passivant layer 323 or defects may exist. Further operations, e.g., chemical-mechanical polishing, dry etch, wet etch, and followed by cleaning operations, may be performed to remove the defects.

At block 211, the process 200 may include forming a second dielectric layer above the first dielectric layer to cover areas not covered by the cap layer. For example, as shown in FIG. 3(f), the process 200 may include forming a dielectric layer 305 above the dielectric layer 303 to cover areas not covered by the cap layer 326. Some residue 328 of the first passivant layer 323 or a gap 329 may exist between the dielectric layer 303 and the dielectric layer 305. As a result, an interconnect structure, or a part of an interconnect structure 320 may be formed, which may be similar to the interconnect structure 120 shown in FIG. 1(d).

FIGS. 4(a)-4(f) illustrate various interconnect structures where a passivant layer with a SAM may be formed, in accordance with various embodiments. Interconnect structures shown in FIGS. 4(a)-4(g) are alternative examples to the interconnect structures having the dielectric layer 303 as shown in FIGS. 3(a)-3(g).

Figure 4A:
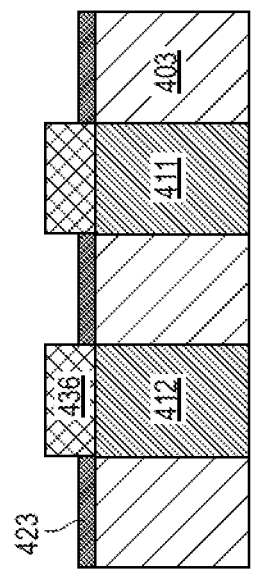
FIGS. 4(a)-4(f) illustrate various interconnect structures where a passivant layer with a SAM may be formed, in accordance with various embodiments.

In embodiments, as shown in FIG. 4(a), a dielectric layer 403 includes one or more conductive components, e.g., a conductive component 411, a conductive component 412, embedded within the dielectric layer 403. A surface of the dielectric layer 403 includes a surface portion having a dielectric material, and a surface portion having a metallic material. One or more segments of a passivant layer 423 are attached to a surface portion having a dielectric material of the dielectric layer 403, but not attached to a surface portion having a metallic material. The passivant layer 423 includes a SAM. The passivant layer 423 may be used to form a pattern so that other features, e.g., a cap layer 436, can be formed above the conductive component 411 and the conductive component 412. The dielectric layer 403, the passivant layer 423, and the cap layer 436 are similar to the dielectric layer 303, the passivant layer 323, and the cap layer 326, as shown in FIG. 3(d).

Figure 4B:
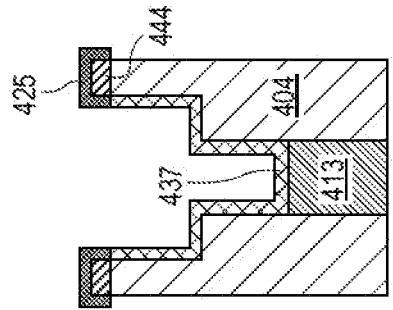

In embodiments, as shown in FIG. 4(b), the dielectric layer 403 includes the conductive component 411 and the conductive component 412, as shown in FIG. 4(a). One or more segments of a passivant layer 424 are attached to a surface portion having a metallic material on top of the conductive component 411 and the conductive component 412, but not attached to a surface portion having a dielectric material. The passivant layer 424 includes a SAM. The passivant layer 424 may be used to form a pattern so that other features, e.g., a cap layer 438, can be formed above dielectric layer 403, but not overlapping with the conductive component 411 and the conductive component 412.

Figure 4C:
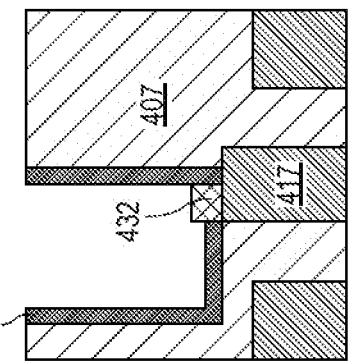

In embodiments, as shown in FIG. 4(c), a dielectric layer 404 includes a conductive component 413 within an opening. A hardmask material 444 may be optionally deposited over the dielectric layer 404. One or more segments of a passivant layer 425 are attached to a surface portion having a dielectric material, e.g., a surface of the hardmask material 444, but not attached to a surface portion of the conductive component 413. The passivant layer 425 includes a SAM. The passivant layer 425 may be used to form a pattern so that other features, e.g., a liner 437, can be formed above the conductive component 413, covering the sidewall of the opening.

Figure 4D:
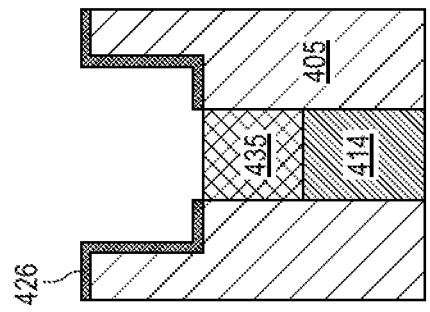

In embodiments, as shown in FIG. 4(d), a dielectric layer 405 includes a conductive component 414 within an opening. One or more segments of a passivant layer 426 are attached to a surface portion having a dielectric material, e.g., a surface of the dielectric layer 405, but not attached to a surface portion of the conductive component 414. The passivant layer 426 includes a SAM. The passivant layer 426 may be used to form a pattern so that other features, e.g., a via 435, can be formed above the conductive component 414.

Figure 4E:
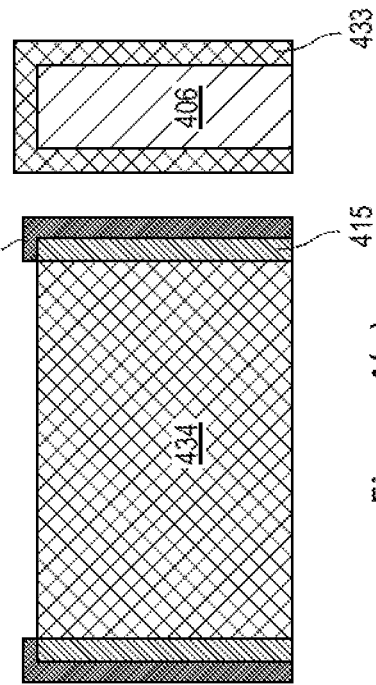

In embodiments, as shown in FIG. 4(e), a dielectric layer 406 includes a conductive component 415. One or more segments of a passivant layer 427 are attached to a surface portion having a metallic material, e.g., a surface of the conductive component 415. The passivant layer 427 includes a SAM. The passivant layer 427 may be used to form a pattern so that other features, e.g., fin sidewall cladding 434 and 433, can be formed at areas not covered by the passivant layer 427.

Figure 4F:
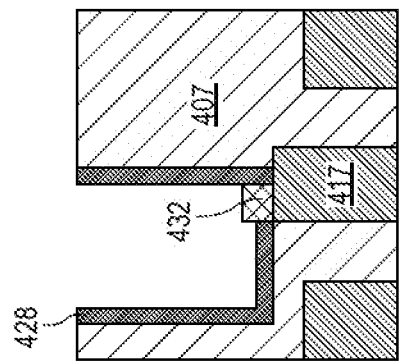

In embodiments, as shown in FIG. 4(f), a dielectric layer 407 includes one or more conductive components, e.g., a conductive component 417. One or more segments of a passivant layer 428 are attached to a surface portion having a dielectric material, e.g., a surface of the dielectric layer 407, but not attached to a surface portion of the conductive component 417. The passivant layer 428 includes a SAM. The passivant layer 428 may be used to form a pattern so that other features, e.g., a metal oxide 432, can be formed above the conductive component 417, which is not covered by the passivant layer 428.

Figure 5:
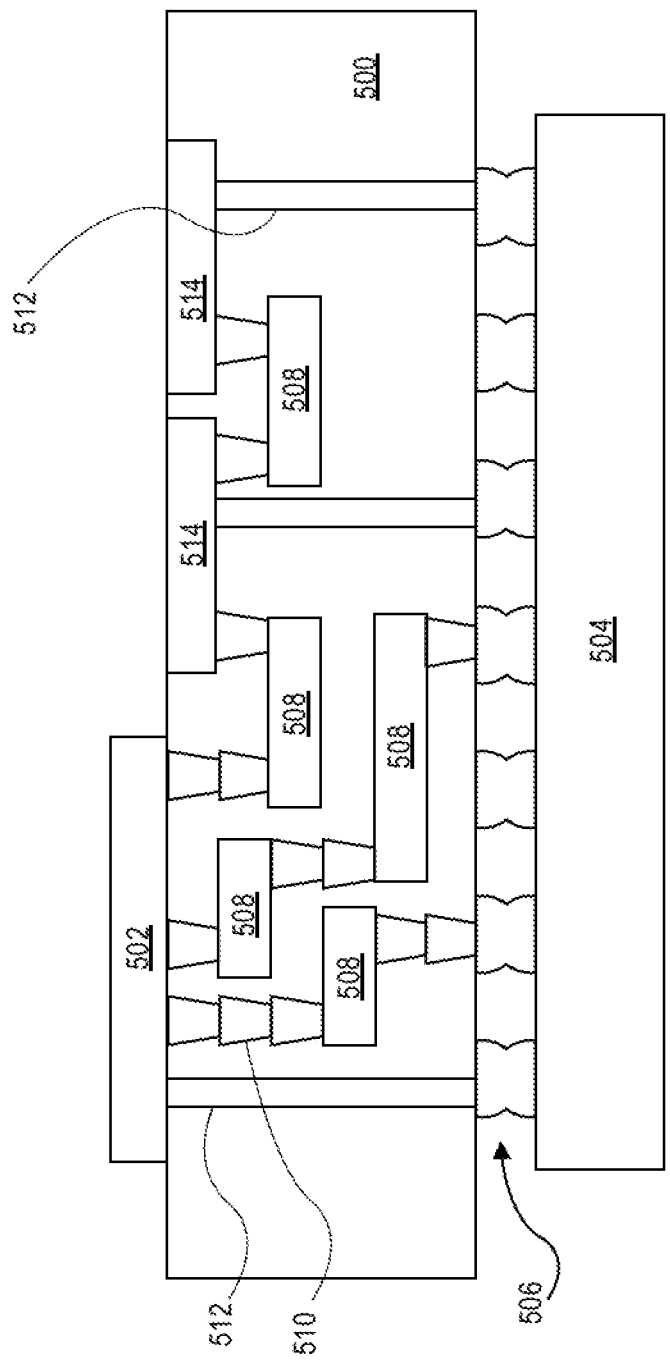
FIG. 5 schematically illustrates a package substrate implementing one or more embodiments of the disclosure, in accordance with various embodiments.

FIG. 5 schematically illustrates a package substrate 500 implementing one or more embodiments of the disclosure, in accordance with some embodiments. The package substrate 500 is an intervening substrate used to bridge a first substrate 502 to a second substrate 504. The first substrate 502 may be, for instance, a substrate support for an IC including an interconnect structure 120 having the passivant layer 123, as shown in FIG. 1(d), or an interconnect structure formed by the process 200, as illustrated in more detail in FIGS. 3(a)-3(g). The second substrate 504 may be, for instance, a memory module, a computer motherboard, or a PCB. For example, a package substrate 500 may couple an integrated circuit die to a ball grid array (BGA) 506 that can subsequently be coupled to the second substrate 504. In some embodiments, the first and second substrates 502/504 are attached to opposing sides of the package substrate 500. In other embodiments, the first and second substrates 502/504 are attached to the same side of the package substrate 500. And, in further embodiments, three or more substrates are interconnected by way of the package substrate 500.

The package substrate 500 may be formed of an epoxy resin, a fiberglass-reinforced epoxy resin, a ceramic material, or a polymer material such as polyimide. In further implementations, the package substrate may be formed of alternate rigid or flexible materials that may include the same materials described above for use in a semiconductor substrate, such as silicon, germanium, and other group III-V and group IV materials.

The package substrate may include metal interconnects 508 and vias 510, including but not limited to through-silicon vias (TSVs) 512. The package substrate 500 may further include embedded devices 514, including both passive and active devices. Such devices include, but are not limited to, capacitors, decoupling capacitors, resistors, inductors, fuses, diodes, transformers, sensors, electrostatic discharge (ESD) devices, or an IC including an interconnect structure 120 having the passivant layer 123, as shown in FIG. 1(d), or an interconnect structure formed by the process 200, as illustrated in more detail in FIGS. 3(a)-3(g). More complex devices such as radio-frequency (RF) devices, power amplifiers, power management devices, antennas, arrays, sensors, and MEMS devices may also be formed on the package substrate 500.

In accordance with embodiments of the disclosure, apparatuses or processes disclosed herein may be used in the fabrication of package substrate 500.

Figure 6:
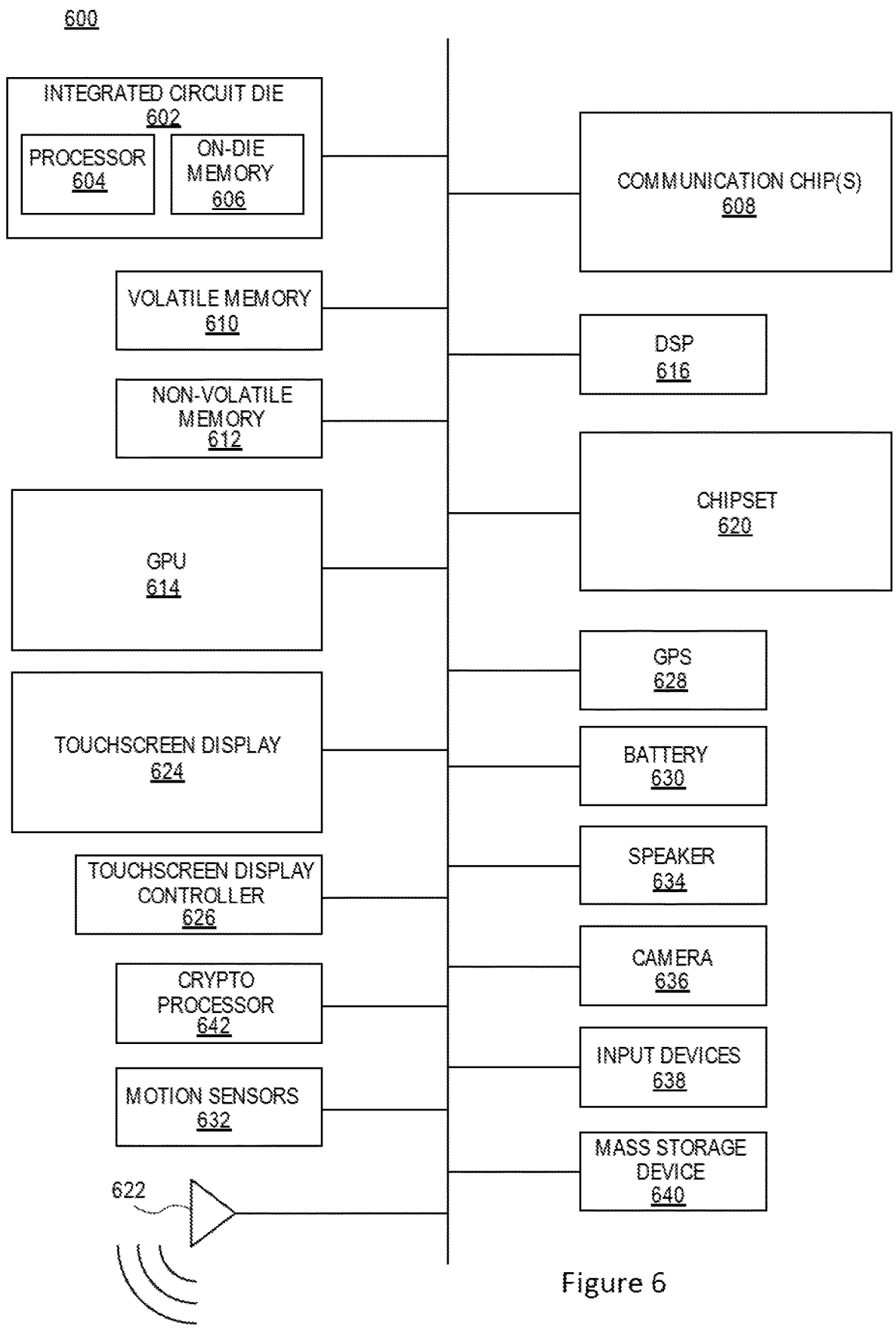
FIG. 6 schematically illustrates a computing device built in accordance with an embodiment of the disclosure, in accordance with various embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606, the processor 604, or the integrated circuit die 602 may include an IC including an interconnect structure 120 having the passivant layer 123, as shown in FIG. 1(d), or an interconnect structure formed by the process 200, as illustrated in more detail in FIGS. 3(a)-3(g).

In embodiments, the computing device 600 may include a display or a touchscreen display 624, and a touchscreen display controller 626. A display or the touchscreen display 624 may include a FPD, an AMOLED display, a TFT LCD, a micro light-emitting diode (μLED) display, or others.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as an IC including an interconnect structure 120 having the passivant layer 123, as shown in FIG. 1(d), or an interconnect structure formed by the process 200, as illustrated in more detail in FIGS. 3(a)-3(g). In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some non-limiting Examples are provided below.

Example 1 may include an integrated circuit, comprising: an interconnect structure including one or more layers above a substrate, wherein a surface of a layer of the one or more layers includes a first portion of the surface having a first material, and a second portion of the surface having a second material; and a segment of a passivant layer attached to the first portion of the surface, the passivant layer including a self-assembled monolayers (SAM), wherein the SAM includes head groups selectively bounded to the first portion of the surface, and chains attached to the head groups, and wherein the chains include functional groups that are cross-linkable at end or side of the chains to result in chain extension by reacting with another SAM or polymer, densification by crosslinking with an adjacent SAM, or polymerization having an initiator as the SAM or the SAM attached to another SAM.

Example 2 may include the integrated circuit of example 1, wherein the functional groups in the chains include CN, OH groups, $N_3$, C≡C, C=C, thiols (SH), amines (NH), epoxides, cyclopropanes, imino groups, aromatic groups, halogens, SiH, SiCl, vinylsilane, or COOH.

Example 3 may include the integrated circuit of example 1, wherein the functional groups in the chains further include alkyl groups, aromatic and polycyclic aromatic groups, fluorinated alkyl groups, combination of alkyl groups with aromatic substituents, (C1-C22) alkyl groups, octadecyl, fluorohydrocarbons, heptadecafluoro, fluorinated groups between C1-C22, fluorinated alkyl groups with fluorinated aromatic substituents, or non-fluorinated alkyl groups with fluorinated aromatic substituents.

Example 4 may include the integrated circuit of examples 1-3, wherein the head groups include phosphoate esters, phosphonate esters, phosphonamide, sulfonamides, sulfenate, sulfinate, sulfonate, or boronic acid, when the SAM is attached to a metallic surface as the first portion of the surface.

Example 5 may include the integrated circuit of examples 1-3, wherein the head groups include alkenes, alkynes, amines, hydroxides, phosphines, thiols, phosphonic acids, carboxylic acids, or phosphorous dichloride, when the SAM is attached to a metallic surface as the first portion of the surface; and the head groups include alkoxysilanes, aminosilanes, or chlorosilanes, or mono-, di- and tri-substituted groups of alkoxysilanes, aminosilanes, or chlorosilanes, when the SAM is attached to a dielectric surface as the first portion of the surface.

Example 6 may include the integrated circuit of examples 1-3, wherein, when the SAM is attached to the dielectric surface, the SAM includes octadecyl trichlorosilane, trimethoxy(octadecyl)silane, triethoxy heptadecafluoro-decylsilane, octadecyltris(dimethylamino)silane or 5-8 membered cyclic silanes such as N-n-butyl-aza-2,2-dimethoxysilacyclopentane triethoxy hexamethylsilanetriamine.

Example 7 may include the integrated circuit of examples 1-3, wherein, when the SAM is attached to the metallic surface, the functional groups in the chains include $C_1$-$C_{22}$, $C_5H_5$-$C_{17}H_{37}$, indenyl, alkenes, alkynes, or phenyl; and the head groups includes $PO_3H_2$, P(O)(OH)(OEt), P(O)(OEt)$_2$O, P(O)(OH)(OSiMe$_3$), P(O)(OSiMe$_3$)$_2$O, P(O)(OEt)$_2$, O, P(O)(OSiMe$_3$)$_2$, P(O)Cl$_2$, P(O)(NMe$_2$)$_2$, P(O)(OH)(NMe$_2$), S(O)$_2$(NMe$_2$), S(O)(NMe$_2$), B(OH)$_2$, P(O)(OGeR$_3$)$_2$, P(O)(OH)(OGeR$_3$), P(O)(OSnR$_3$)$_2$, P(O)(OH)(OSnR$_3$), P(O)(OBR$_2$)$_2$, P(O)(OH)(OBR$_2$), P(O)(OAlR$_2$)$_2$, P(O)(OH)(OAlR$_2$), R$_3$PO, R$_3$OP, COOH, amides, CN, enamides, amidinates, guanidinates, enolates with SiMe$_3$ substituents, or guanidinates, enolates without SiMe$_3$ substituents.

Example 8 may include the integrated circuit of example 7, wherein the SAM includes a material selected from the group consisting of $C_{18}H_{37}PO_3H_2$, $C_{18}H_{37}P(O)(OH)(OEt)$, $C_{18}H_{37}P(O)(OEt)_2$, $C_{18}H_{37}P(O)Cl_2$, $C_{18}H_{37}P(O)(OH)Cl$, $C_{18}H_{37}P(O)(NMe_2)_2$, $C_{18}H_{37}P(O)(OH)(NMe_2)$, $C_{18}H_{37}S(O)_2(NMe_2)$, $C_{18}H_{37}S(O)(OSiMe_3)$, $C_{18}H_{37}S(OSiMe_3)$, $C_{18}H_{37}S(O)_2(OSiMe_3)$, $C_{18}H_{37}S(O)(NMe_2)$, $C_{18}H_{37}B(OH)_2$, $C_5H_5$-$C_{17}H_{37}$,
$C_{18}H_{37}P(O)(OH)(OGeR_3)$, $C_{18}H_{37}P(O)(OGeR_3)_2$, $(C_{18}H_{37}P(O)(OGeR_3))_2O$; $(C_{18}H_{37}P(O)(OGeR_3))_2(CH_2)_n$, $(C_{18}H_{37}P(O)(OGeR_3))_2(C_6H_4)_n$, $C_{18}H_{37}OP(O)(OGeR_3)_2$, $(C_{18}H_{37}OP(O)(OGeR_3))_2(CH_2)_n$, $(C_{18}H_{37}OP(O)(OGeR_3))_2(C_6H_4)_n$, $C_{18}H_{37}OP(O)(OH)(OGeR_3)$, $(C_{18}H_{37}OP(O)(OGeR_3))_2O$; $C_{18}H_{37}S(O)_2(OGeR_3)$, $C_{18}H_{37}S(O)(OGeR_3)$, $C_{18}H_{37}S(OGeR_3)$, $C_{18}H_{37}B(OGeR_3)_2$;
$C_{18}H_{37}P(O)(OH)(OSnR_3)$, $C_{18}H_{37}P(O)(OSnR_3)_2$, $(C_{18}H_{37}P(O)(OSnR_3))_2O$, $(C_{18}H_{37}P(O)(OSnR_3))_2(CH_2)_n$, $(C_{18}H_{37}P(O)(OSnR_3))_2(C_6H_4)_n$, $C_{18}H_{37}OP(O)(OSnR_3)_2$, $C_{18}H_{37}OP(O)(OH)(OSnR_3)$, $(C_{18}H_{37}OP(O)(OSnR_3))_2O$, $(C_{18}H_{37}OP(O)(OSnR_3))_2(CH_2)_n$, $(C_{18}H_{37}OP(O)(OSnR_3))_2(C_6H_4)_n$, $C_{18}H_{37}S(O)_2(OSnR_3)$, $C_{18}H_{37}S(O)(OSnR_3)$, $C_{18}H_{37}S(OSnR_3)$, $C_{18}H_{37}B(OSnR_3)_2$;
$C_{18}H_{37}P(O)(OH)(OBR_2)$, $C_{18}H_{37}P(O)(OBR_2)_2$, $(C_{18}H_{37}P(O)(OBR_2))_2O$, $(C_{18}H_{37}P(O)(OBR_2))_2(CH_2)_n$, $(C_{18}H_{37}P(O)(OBR_2))_2(C_6H_4)_n$, $C_{18}H_{37}OP(O)(OBR_2)_2$, $C_{18}H_{37}OP(O)(OH)(OBR_2)$, $(C_{18}H_{37}OP(O)(OBR_2))_2O$, $(C_{18}H_{37}OP(O)(OBR_2))_2(CH_2)_n$, $(C_{18}H_{37}OP(O)(OBR_2))_2(C_6H_4)_n$, $C_{18}H_{37}S(O)_2(OBR_2)$, $C_{18}H_{37}S(O)(OBR_2)$, $C_{18}H_{37}S(OBR_2)$, $C_{18}H_{37}B(OBR_2)_2$, $C_{18}H_{37}B(OH)_2$, $C_{18}H_{37}B(OSiMe_3)_2$;
$C_{18}H_{37}P(O)(OH)(OAlR_2)$, $C_{18}H_{37}P(O)(OAlR_2)_2$, $(C_{18}H_{37}P(O)(OAlR_2))_2O$, $(C_{18}H_{37}P(O)(OAlR_2))_2(CH_2)_n$, $(C_{18}H_{37}P(O)(OAlR_2))_2(C_6H_4)_n$, $C_{18}H_{37}OP(O)(OAlR_2)_2$, $(C_{18}H_{37}OP(O)(OAlR_2))_2O$, $C_{18}H_{37}P(O)(OH)(OAlR_2)$, $(C_{18}H_{37}OP(O)(OAlR_2))_2(CH_2)_n$, $(C_{18}H_{37}OP(O)(OAlR_2))_2(C_6H_4)_n$, $C_{18}H_{37}S(O)_2(OAlR_2)$, $C_{18}H_{37}S(O)(OAlR_2)$, $C_{18}H_{37}S(OAlR_2)$, and $C_{18}H_{37}B(OAlR_2)_2$.

Example 9 may include the integrated circuit of examples 1-8, wherein the head groups of the SAM have a first reaction to the first portion of the surface, and the SAM includes end groups attached to the chains, wherein the end groups include an orthogonal type of chemical functionality that allows a second reaction with a polymerization material, a chain extension with another SAM or with an adjacent SAM.

Example 10 may include the integrated circuit of example 9, wherein the end groups include aminosilanes(CH$_2$)$_n$phosphonate, alkokysilane(CH$_2$)$_n$phosphonate, hydrosilanes (CH$_2$)$_n$phosphonate, aminoalkylphosphonate, cyanoalkylphosphonate, alkynylalkylphosphonate, azidoalkylphosphonate, hydroxyalkylphosphonate, or epoxyalkylphosphonate, CN, OH groups, $N_3$, C≡C, C=C, thiols (SH), amines (NH), epoxides, cyclopropanes, imino groups, aromatic groups, halogens, silyl groups (SiH, SiCl, vinylsilane) and COOH or an orthogonally reactive material for a third reaction with an adjacent SAM by cross-linking.

Example 11 may include the integrated circuit of examples 1-10, wherein the SAM is a first sublayer of the passivant layer, and the passivant layer further includes a second passivant sublayer including hydrophobic polymer brushes with an end group, or a molecule including a chain with 1 to 22 C atoms and an end group.

Example 12 may include the integrated circuit of example 11, wherein the second passivant sublayer is attached to the SAM by chain extension, cross linking, or polymerization with the SAM as an initiator.

Example 13 may include the integrated circuit of examples 1-12, further comprising HfO2, ZrO2, Al2O3, Y2O3, SiO2, SiO2, Al2O3, HfN, ZrN, AlN, SiN, RuN, TaN, TaCN, carbides, carbo nitirdes, borides, metal nitride, metal carbo nitride, or a high-k material compatible with the SAM.

Example 14 may include the integrated circuit of examples 1-13, further comprising a gap resulted from removing another segment of the SAM in the passivant layer.

Example 15 may include the integrated circuit of examples 1-14, wherein the first portion of the surface is a metallic surface selected from a metal surface, a metal oxide surface, or a silicon oxide surface; or the first portion of the surface is a dielectric surface selected from a surface of an interlayer dielectric (ILD) layer, a hardmask layer, or a dielectric capping layer.

Example 16 may include the integrated circuit of examples 1-15, wherein the SAM is located in a via opening, on a side surface or a top surface of a fin structure, a gate structure, a via, a liner, a sidewall, a contact structure, or a structure in a semiconductor device.

Example 17 may include a method for forming a semiconductor device, comprising: providing a dielectric layer including one or more conductive components embedded within the dielectric layer, wherein the dielectric layer is a part of an interconnect structure of the semiconductor device, and wherein a surface of the dielectric layer includes a first surface portion having a dielectric material, and a second surface portion having a metallic material; and forming one or more segments of a passivant layer attached to a portion selected from the first surface portion or the second surface portion of the dielectric layer, the passivant layer including a self-assembled monolayers (SAM), wherein the SAM includes head groups selectively bounded to the selected portion, and chains attached to the head groups, and wherein the chains include functional groups that are cross-linkable at end or side of the chains to result in chain extension by reacting with another SAM or polymer, densification by crosslinking with an adjacent SAM, or polymerization having an initiator as the SAM or the SAM attached to another SAM.

Example 18 may include the method of example 17, wherein the SAM is a first sublayer of the passivant layer, and the method further comprises: forming a second passivant sublayer including hydrophobic polymer brushes with an end group, or a molecule including a chain with 1 to 22 C atoms and an end group, wherein the second passivant sublayer is attached to the SAM of the first sublayer by chain extension, cross linking, or polymerization with the SAM as an initiator.

Example 19 may include the method of examples 17-18, wherein the dielectric layer is at least partially covered by a contaminated layer, and the method further comprises: cleaning up the dielectric layer by removing the contaminated layer.

Example 20 may include the method of examples 17-19, further comprising: selective depositing a cap layer on the first surface portion or the second surface portion of the dielectric layer not covered by the one or more segments of the passivant layer.

Example 21 may include the method of example 20, wherein the dielectric layer is a first dielectric layer, and the method further comprises: removing the one or more segments of the passivant layer from the selected portion; and forming a second dielectric layer above the first dielectric layer to cover areas not covered by the cap layer.

Example 22 may include the method of example 21, wherein a residue of the passivant layer or a gap exists between the first dielectric layer and the second dielectric layer.

Example 23 may include a computing device, comprising: a printed circuit board (PCB); and a semiconductor device coupled to the PCB and including an active device or a passive device, wherein the semiconductor device includes: an interconnect structure including one or more layers above a substrate, wherein a surface of a layer of the one or more layers includes a first portion of the surface having a first material, and a second portion of the surface having a second material; and a segment of a passivant layer attached to the first portion of the surface, the passivant layer including a self-assembled monolayers (SAM), wherein the SAM includes head groups selectively bounded to the first portion of the surface, and chains attached to the head groups, and wherein the chains include functional groups that are cross-linkable at end or side of the chains to result in chain extension by reacting with another SAM or polymer, densification by crosslinking with an adjacent SAM, or polymerization having an initiator as the SAM or the SAM attached to another SAM.

Example 24 may include the computing device of example 23, wherein the functional groups in the chains include CN, OH groups, $N_3$, C≡C, C=C, thiols (SH), amines (NH), epoxides, cyclopropanes, imino groups, aromatic groups, halogens, SiH, SiCl, vinylsilane, or COOH; and wherein the head groups include alkenes, alkynes, amines, hydroxides, phosphines, thiols, phosphonic acids, carboxylic acids, or phosphorous dichloride, when the SAM is attached to a metallic surface as the first portion of the surface; and the head groups include alkoxysilanes, aminosilanes, or chlorosilanes, or mono-, di- and tri-substituted groups of alkoxysilanes, aminosilanes, or chlorosilanes, when the SAM is attached to a dielectric surface as the first portion of the surface.

Example 25 may include the computing device of examples 23-24, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit, comprising:
    an interconnect structure including one or more layers above a substrate, wherein a surface of a layer of the one or more layers includes a first portion of the surface having a first material, and a second portion of the surface having a second material; and
    a segment of a passivant layer attached to the first portion of the surface, the passivant layer including a self-assembled monolayers (SAM), wherein the SAM includes head groups selectively bounded to the first portion of the surface, and chains attached to the head groups, and wherein the chains include functional groups that are cross-linkable at end or side of the chains to result in chain extension by reacting with another SAM or polymer, densification by crosslinking with an adjacent SAM, or polymerization having an initiator as the SAM or the SAM attached to another SAM, the functional groups in the chains selected from the group consisting of CN, OH groups, $N_3$, C≡C, C=C, amines (NH), epoxides, cyclopropanes, imino groups, aromatic groups, halogens, SiH, SiCl, vinylsilane, or COOH.

2. The integrated circuit of claim 1, wherein the functional groups in the chains further include alkyl groups, aromatic and polycyclic aromatic groups, fluorinated alkyl groups, combination of alkyl groups with aromatic substituents, (C1-C22) alkyl groups, octadecyl, fluorohydrocarbons, heptadecafluoro, fluorinated groups between C1-C22, fluorinated alkyl groups with fluorinated aromatic substituents, or non-fluorinated alkyl groups with fluorinated aromatic substituents.

3. The integrated circuit of claim 1, wherein the head groups include phosphoate esters, phosphonate esters, phosphonamide, sulfonamides, sulfenate, sulfinate, sulfonate, or boronic acid, when the SAM is attached to a metallic surface as the first portion of the surface.

4. The integrated circuit of claim 1, wherein the head groups include alkenes, alkynes, amines, hydroxides, phosphines, thiols, phosphonic acids, carboxylic acids, or phosphorous dichloride, when the SAM is attached to a metallic surface as the first portion of the surface; and
    the head groups include alkoxysilanes, aminosilanes, or chlorosilanes, or mono-, di- and tri-substituted groups of alkoxysilanes, aminosilanes, or chlorosilanes, when the SAM is attached to a dielectric surface as the first portion of the surface.

5. The integrated circuit of claim 1, wherein, when the SAM is attached to a dielectric surface, the SAM includes octadecyl trichlorosilane, trimethoxy(octadecyl)silane, triethoxy heptadecafluorodecylsilane, octadecyltris(dimethylamino)silane or 5-8 membered cyclic silanes such as N-n-butyl-aza-2,2-dimethoxysilacyclopentane triethoxy hexamethylsilanetriamine.

6. The integrated circuit of claim 1, wherein, when the SAM is attached to a metallic surface, the functional groups in the chains include $C_1$-$C_{22}$, $C_5H_5$-$C_{17}H^{37}$, indenyl, alkenes, alkynes, or phenyl; and the head groups includes $PO_3H_2$, $P(O)(OH)(OEt)$, $P(O)(OEt)_2O$, $P(O)(OH)(OSiMe_3)$, $P(O)(OSiMe_3))_2O$, $P(O)(OEt)_2$, $P(O)(OSiMe_3)_2$, $P(O)Cl_2$, $P(O)(NMe_2)_2$, $P(O)(OH)(NMe_2)$, $S(O)_2(NMe_2)$, $S(O)(NMe_2)$, $B(OH)_2$, $P(O)(OGeR_3)_2$, $P(O)(OH)(OGeR_3)$, $P(O)(OSnR_3)_2$, $P(O)(OH)(OSnR_3)$, $P(O)(OBR_2)_2$, $P(O)(OH)(OBR_2)$, $P(O)(OAlR_2)_2$, $P(O)(OH)(OAlR_2)$, $R_3PO$, $R_3OP$, COOH, amides, CN, enamides, amidinates, guanidinates, enolates with $SiMe_3$ substituents, or guanidinates, enolates without $SiMe_3$ substituents.

7. The integrated circuit of claim 6, wherein the SAM includes a material selected from the group consisting of $C_{18}H_{37}PO_3H_2$, $C_{18}H_{37}P(O)(OH)(OEt)$, $C_{18}H_{37}P(O)(OEt)_2$, $C_{18}H_{37}P(O)Cl_2$, $C_{18}H_{37}P(O)(OH)Cl$, $C_{18}H_{37}P(O)(NMe_2)_2$, $C_{18}H_{37}P(O)(OH)(NMe_2)$, $C_{18}H_{37}S(O)_2(NMe_2)$, $C_{18}H_{37}S(O)(OSiMe_3)$, $C_{18}H_{37}S(OSiMe_3)$, $C_{18}H_{37}S(O)_2(OSiMe_3)$, $C_{18}H_{37}S(O)(NMe_2)$, $C_{18}H_{37}B(OH)_2$, $C_5H_5$-$C_{17}H_{37}$,
    $C_{18}H_{37}P(O)(OH)(OGeR_3)$, $C_{18}H_{37}P(O)(OGeR_3)_2$, $(C_{18}H_{37}P(O)(OGeR_3))_2O$;
    $(C_{18}H_{37}P(O)(OGeR_3))_2(CH_2)_n$, $(C_{18}H_{37}P(O)(OGeR_3))_2(C_6H_4)_n$, $C_{18}H_{37}OP(O)(OGeR_3)_2$, $(C_{18}H_{37}OP(O)(OGeR_3))_2(CH_2)_n$, $(C_{18}H_{37}OP(O)(OGeR_3))_2(C_6H_4)_n$, $C_{18}H_{37}OP(O)(OH)(OGeR_3)$, $(C_{18}H_{37}OP(O)(OGeR_3))_2O$; $C_{18}H_{37}S(O)_2(OGeR_3)$, $C_{18}H_{37}S(O)(OGeR_3)$, $C_{18}H_{37}S(OGeR_3)$, $C_{18}H_{37}B(OGeR_3)_2$;
    $C_{18}H_{37}P(O)(OH)(OSnR_3)$, $C_{18}H_{37}P(O)(OSnR_3)_2$, $(C_{18}H_{37}P(O)(OSnR_3))_2O$, $(C_{18}H_{37}P(O)(OSnR_3))_2(CH_2)_n$, $(C_{18}H_{37}P(O)(OSnR_3))_2(C_6H_4)_n$, $C_{18}H_{37}OP(O)(OSnR_3)_2$, $C_{18}H_{37}OP(O)(OH)(OSnR_3)$, $(C_{18}H_{37}OP(O)(OSnR_3))_2O$, $(C_{18}H_{37}OP(O)(OSnR_3))_2(CH_2)_n$, $(C_{18}H_{37}OP(O)(OSnR_3))_2(C_6H_4)_n$, $C_{18}H_{37}S(O)_2(OSnR_3)$, $C_{18}H_{37}S(O)(OSnR_3)$, $C_{18}H_{37}S(OSnR_3)$, $C_{18}H_{37}B(OSnR_3)_2$;
    $C_{18}H_{37}P(O)(OH)(OBR_2)$, $C_{18}H_{37}P(O)(OBR_2)_2$, $(C_{18}H_{37}P(O)(OBR_2))_2O$, $(C_{18}H_{37}P(O)(OBR_2))_2(CH_2)_n$, $(C_{18}H_{37}P(O)(OBR_2))_2(C_6H_4)_n$, $C_{18}H_{37}OP(O)(OBR_2)_2$, $C_{18}H_{37}OP(O)(OH)(OBR_2)$, $(C_{18}H_{37}OP(O)(OBR_2))_2O$, $(C_{18}H_{37}OP(O)(OBR_2))_2(CH_2)_n$, $(C_{18}H_{37}OP(O)(OBR_2))_2(C_6H_4)_n$, $C_{18}H_{37}S(O)_2(OBR_2)$, $C_{18}H_{37}S(O)(OBR_2)$, $C_{18}H_{37}S(OBR_2)$, $C_{18}H_{37}B(OBR_2)_2$, $C_{18}H_{37}B(OH)_2$, $C_{18}H_{37}B(OSiMe_3)_2$;
    $C_{18}H_{37}P(O)(OH)(OAlR_2)$, $C_{18}H_{37}P(O)(OAlR_2)_2$, $(C_{18}H_{37}P(O)(OAlR_2))_2O$, $(C_{18}H_{37}P(O)(OAlR_2))_2(CH_2)_n$, $(C_{18}H_{37}P(O)(OAlR_2))_2(C_6H_4)_n$, $C_{18}H_{37}OP(O)(OAlR_2)_2$, $(C_{18}H_{37}OP(O)(OAlR_2))_2O$, $C_{18}H_{37}P(O)(OH)(OAlR_2)$, $(C_{18}H_{37}OP(O)(OAlR_2))_2(CH_2)_n$, $(C_{18}H_{37}OP(O)(OAlR_2))_2(C_6H_4)_n$, $C_{18}H_{37}S(O)_2(OAlR_2)$, $C_{18}H_{37}S(O)(OAlR_2)$, $C_{18}H_{37}S(OAlR_2)$, and $C_{18}H_{37}B(OAlR_2)_2$.

8. The integrated circuit of claim 1, wherein the head groups of the SAM have a first reaction to the first portion of the surface, and the SAM includes end groups attached to the chains, wherein the end groups include an orthogonal type of chemical functionality that allows a second reaction with a polymerization material, a chain extension with another SAM or with an adjacent SAM.

9. The integrated circuit of claim 8, wherein the end groups include aminosilanes($CH_2$)$_n$phosphonate, alkokysilane($CH_2$)$_n$phosphonate, hydrosilanes($CH_2$)$_n$phosphonate, aminoalkylphosphonate, cyanoalkylphosphonate, alkynylalkylphosphonate, azidoalkylphosphonate, hydroxyalkylphosphonate, or epoxyalkylphosphonate, CN, OH groups, $N_3$, C≡C, C=C, thiols (SH), amines (NH), epoxides, cyclopropanes, imino groups, aromatic groups, halogens, silyl groups (SiH, SiCl, vinylsilane) and COOH or an orthogonally reactive material for a third reaction with an adjacent SAM by cross-linking.

10. The integrated circuit of claim 1, wherein the SAM is a first sublayer of the passivant layer, and the passivant layer further includes a second passivant sublayer including hydrophobic polymer brushes with an end group, or a molecule including a chain with 1 to 22 C atoms and an end group.

11. The integrated circuit of claim 10, wherein the second passivant sublayer is attached to the SAM by chain extension, cross linking, or polymerization with the SAM as an initiator.

12. The integrated circuit of claim 1, further comprising $HfO_2$, $ZrO_2$, $Al_2O_3$, $Y_2O_3$, $SiO_2$, $Al_2O_3$, HfN, ZrN, AlN, SiN, RuN, TaN, TaCN, carbides, carbo nitrides, borides, metal nitride, metal carbo nitride, or a high-k material compatible with the SAM.

13. The integrated circuit of claim 1, further comprising a gap resulted from removing another segment of the SAM in the passivant layer.

14. The integrated circuit of claim 1, wherein the first portion of the surface is a metallic surface selected from a metal surface, a metal oxide surface, or a silicon oxide surface; or the first portion of the surface is a dielectric surface selected from a surface of an interlayer dielectric (ILD) layer, a hardmask layer, or a dielectric capping layer.

15. The integrated circuit of claim 1, wherein the SAM is located in a via opening, on a side surface or a top surface of a fin structure, a gate structure, a via, a liner, a sidewall, a contact structure, or a structure in a semiconductor device.

16. A computing device, comprising:
a printed circuit board (PCB); and
a semiconductor device coupled to the PCB and including an active device or a passive device, wherein the semiconductor device includes:
an interconnect structure including one or more layers above a substrate, wherein a surface of a layer of the one or more layers includes a first portion of the surface having a first material, and a second portion of the surface having a second material; and
a segment of a passivant layer attached to the first portion of the surface, the passivant layer including a self-assembled monolayers (SAM), wherein the SAM includes head groups selectively bounded to the first portion of the surface, and chains attached to the head groups, and wherein the chains include functional groups that are cross-linkable at end or side of the chains to result in chain extension by reacting with another SAM or polymer, densification by crosslinking with an adjacent SAM, or polymerization having an initiator as the SAM or the SAM attached to another SAM, the functional groups in the chains selected from the group consisting of CN, OH groups, $N_3$, C≡C, C=C, amines (NH), epoxides, cyclopropanes, imino groups, aromatic groups, halogens, SiH, SiCl, vinylsilane, or COOH.

17. The computing device of claim 16,
wherein the head groups include alkenes, alkynes, amines, hydroxides, phosphines, thiols, phosphonic acids, carboxylic acids, or phosphorous dichloride, when the SAM is attached to a metallic surface as the first portion of the surface; and
the head groups include alkoxysilanes, aminosilanes, or chlorosilanes, or mono-, di- and tri-substituted groups of alkoxysilanes, aminosilanes, or chlorosilanes, when the SAM is attached to a dielectric surface as the first portion of the surface.

18. The computing device of claim 16, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *